(12) United States Patent
Aidan et al.

(10) Patent No.: US 12,158,805 B1
(45) Date of Patent: Dec. 3, 2024

(54) CORRECTING UNCORRECTABLE MEMORY ERRORS IN DUAL IN-LINE MEMORY MODULES (DIMMS) USING ERASURE CODE

(71) Applicant: Google LLC, Mountain View, CA (US)

(72) Inventors: Fabrice Aidan, Ramat HaSharon (IL); Amir Mulla, Tel-Aviv (IL)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 18/200,346

(22) Filed: May 22, 2023

(51) Int. Cl.
*G06F 11/10* (2006.01)

(52) U.S. Cl.
CPC ............................ *G06F 11/1016* (2013.01)

(58) Field of Classification Search
CPC .................................................. G06F 11/1016
See application file for complete search history.

(56) References Cited

U.S. PATENT DOCUMENTS

| | | | |
|---|---|---|---|
| 4,209,846 A | 6/1980 | Seppa | |
| 4,255,808 A | 3/1981 | Schaber | |
| 6,519,736 B1* | 2/2003 | Chen | H03M 13/19 |
| | | | 714/768 |
| 7,971,112 B2 | 6/2011 | Murata | |
| 2006/0112306 A1 | 5/2006 | Chessin et al. | |
| 2008/0010566 A1 | 1/2008 | Chang et al. | |
| 2010/0185897 A1 | 7/2010 | Abts et al. | |
| 2012/0079351 A1 | 3/2012 | Cideciyan et al. | |
| 2015/0067444 A1* | 3/2015 | Eguchi | G06F 11/1048 |
| | | | 714/766 |
| 2015/0089164 A1* | 3/2015 | Ware | G11C 29/023 |
| | | | 711/149 |
| 2016/0284424 A1 | 9/2016 | Das et al. | |

(Continued)

FOREIGN PATENT DOCUMENTS

| | | |
|---|---|---|
| JP | H0816483 A | 1/1996 |
| WO | 2022116706 A1 | 6/2022 |
| WO | 2022139849 A1 | 6/2022 |

OTHER PUBLICATIONS

Extended European Search Report for European Patent Application No. 23216912.8 dated May 16, 2024. 11 pages.

(Continued)

*Primary Examiner* — Matthew M Kim
*Assistant Examiner* — Matthew N Putaraksa
(74) *Attorney, Agent, or Firm* — Lerner David LLP

(57) ABSTRACT

Aspects of the disclosed technology include techniques and mechanisms for correcting uncorrectable memory errors in DIMMs using erasure code. An uncorrectable error may be detected as a result of a read transaction on a memory address within a DRAM device on a DIMM. The data stored in the memory address may be inverted to produce reference data and the reference data may be written back to the memory address. A subsequent read transaction may be executed on the memory address, and the data read from the memory address may be compared to the reference data written to the memory address. Based on determining the data read from the memory address is different from the reference data written to the memory address, the data within the memory address may be corrected using erasure code capability and the corrected data may be written back to the memory address.

20 Claims, 7 Drawing Sheets

(56) References Cited

U.S. PATENT DOCUMENTS

| | | |
|---|---|---|
| 2017/0123879 A1 | 5/2017 | Donlin |
| 2017/0269979 A1 | 9/2017 | Gollub et al. |
| 2018/0046541 A1 | 2/2018 | Niu et al. |
| 2019/0088349 A1* | 3/2019 | Pyo .................. G11C 29/46 |
| 2019/0179704 A1 | 6/2019 | Niu et al. |
| 2023/0063804 A1 | 3/2023 | Kim |

OTHER PUBLICATIONS

Kim et al., "Bamboo ECC: Strong, Safe, and Flexible Codes for Reliable Computer Memory," 2015 IEEE 21st International Symposium on High Performance Computer Architecture (HPCA), Burlingame, CA, USA, 2015. 12 pages.

Kim and Erez, "Balancing Reliability, Cost, and Performance Tradeoffs with FreeFault," 2015 IEEE 21st International Symposium on High Performance Computer Architecture (HPCA), Burlingame, CA, USA, 2015. 13 pages.

Lavery, "Discriminating Between Soft Errors and Hard Errors in RAM," Application Report SPNA109, Texas Instruments, Jul. 2008. 5 pages.

Li et al., "From Correctable Memory Errors to Uncorrectable Memory Errors: What Error Bits Tell," The International Conference for High Performance Computing, Networking, Storage, and Analysis (SC22), Dallas, TX, USA, 2022. 14 bages.

Li et al., "Short Paper: A Memory Soft Error Measurement on Production Systems," 2007 USENIX Annual Technical Conference (USENIX ATC 07), Santa Clara, CA, USA, 2007, pp. 275-280.

Extended European Search Report for European Patent Application No. 23194720.1 dated Jan. 31, 2024. 7 pages.

International Search Report and Written Opinion for International Application No. PCT/US2024/019707 dated Jun. 17, 2024. 11 pages.

\* cited by examiner

CORRECTING UNCORRECTABLE MEMORY ERRORS IN DUAL IN-LINE MEMORY MODULES (DIMMS) USING ERASURE CODE

BACKGROUND

Day-to-day operations of enterprise organizations may generate large amounts of data, often stored in computing environments offered via the cloud (e.g., networks of servers, storage, databases, software, and other services made available by cloud platform providers). Cloud services may be hosted in various data centers located in different geographic locations. Each data center may house computing resources and networking equipment configured to receive, process, store the data transmitted to the data center, and/or transmit processed data to end user devices or other data centers.

Data centers may use dynamic random access memory devices (DRAM devices) to receive, process, store, and/or transmit data. The DRAM devices may be critical to the operations and/or functions of the data centers and, consequently, the longevity and reliability of the DRAM devices may be of tantamount importance. However, DRAM devices may be vulnerable to faults that may cause data or symbol errors when reading data from and/or writing data to the DRAM device. Faults may occur because of underlying hardware defects within the DRAM device. Faults, in some instances, may compromise the functionality and life cycle of the impacted DRAM device and, ultimately, a Dual Inline Memory Module (DIMM) that includes the impacted DRAM device. In particular, a fault may compromise how the DRAM device receives, processes, reads, writes, and/or stores the data. In some instances, faults may lead to hardware failure, software system crashes, or the like.

Current solutions to identify and correct faults may use symbol-led error correction schemes (e.g., Reed-Solomon (RS) code, array codes, or the like) to detect and correct errors caused by such faults when they are detected as a result of a DRAM memory read transaction. For example, error correction code (ECC) symbols may be added to the DRAM device (e.g., by a memory controller) to detect and correct memory errors on the DRAM device. ECC symbols may be used to correct memory errors caused by faulty I/O data pins (DQs). A portion of available DRAM device storage may be used to store the ECC symbols on the DRAM device. Therefore, a size of the DRAM device and a number of bits used to store the ECC symbols may impact the capacity of the ECC to detect and correct multiple memory errors.

Errors may be categorized as one of either a correctable error (CE) or an uncorrectable error (UE). A CE may be detected and corrected using ECC symbols stored within the DRAM device. Alternatively, when a UE is detected, it might not be correctable. An error may be considered uncorrectable if the number of available ECC symbols is insufficient (e.g., when the number of detected errors exceeds the number of ECC symbols available within the DRAM device). Therefore, current solutions for detecting and correcting faults that may lead to memory errors might not permit DRAM devices to correct a total number of UEs using the ECC.

SUMMARY

Aspects of the disclosed technology may include a method, apparatus, and/or system associated with correcting uncorrectable memory errors in DIMMs using erasure code. An uncorrectable error may be detected as a result of a read transaction on a memory address within a DRAM device on a DIMM. The data stored in the memory address may undergo a bitwise flip and the inverted data may be used to produce reference data. The reference data may be written back to the memory address. A subsequent read transaction may be executed on the memory address, and the data read from the memory address may be compared to the reference data written to the memory address. Based on determining the data read from the memory address is the same as the reference data written to the memory address, additional read transactions may be executed on the memory address to determine whether the initial uncorrectable error was incorrectly flagged.

Alternatively, based on determining the data read from the memory address is different from the reference data written to the memory address, the data within the memory address may be corrected using erasure code capability and the corrected data may be written back to the memory address. The erasure code capability described herein includes using a symbol-led error correction scheme to detect and correct memory errors. In some examples, a Reed Solomon (RS) scheme may be used to execute the erasure code capability. The RS scheme may indicate a number of data symbols that may be stored on a DIMM and a number of ECC symbols that may be stored on the same DIMM. When a memory error is detected as a result of a read transaction, the incorrect data symbol may be corrected using the stored ECC symbols. The number of detected errors that can be corrected using the stored ECC symbols may depend at least on the size of the DIMM and the number of ECC symbols stored on the DIMM. Erasure code capability and RS schemes are described in further detail below.

One aspect of the disclosure provides a method for correcting uncorrectable errors associated with a DRAM device, the method comprising: detecting an uncorrectable error associated with a first data read from a memory address of the DRAM device; inverting the first data read from the memory address to produce reference data and generating a reference error correction code (ECC) associated with the reference data; writing the reference data to the memory address to form written reference data; reading the reference data from the memory address to form read reference data; comparing the read reference data to the written reference data to determine whether there is a mismatched bit pattern indicating at least one mismatched bit between the written reference data and the read reference data; identifying one or more faulty data pins (DQs) associated with the DRAM device based on the mismatched bit pattern; and correcting, using the mismatched bit pattern, the uncorrectable error located at the one or more identified faulty DQs.

According to some examples, inverting the first data comprises performing a bitwise flip on the first data. According to some examples, correcting the uncorrectable error comprises correcting the first data based on the identified one or more faulty DQs and one or more ECCs associated with the first data to produce corrected data. According to some examples, a number of errors that can be corrected using ECC symbols is equal to a number of ECC symbols associated with the first data and stored in the DRAM device.

In the foregoing embodiments, the method further comprises providing, to a CPU associated with the DRAM device, corrected data generated from correcting the first data. In the foregoing embodiments, the method further comprises writing the corrected data to the memory address associated with the first data.

In the foregoing embodiments, the method further comprises, based on determining the read reference data matches the written reference data: executing additional read transactions on the memory address; comparing data read from the memory address as a result of the additional read transactions to new reference data written to the memory address; and based on determining the data read from the memory address as a result of the additional read transactions matches the new reference data written to the memory address: determining the memory address is not associated with a faulty DQ; and flagging the memory address and a corresponding DQ for manual inspection.

In the foregoing embodiments, the method further comprises performing a plurality of read requests on the memory address; and characterizing, based on the plurality of read requests, the uncorrectable error, wherein error characterizations comprise one or more of a transient error, an intermittent error, and a permanent error.

Another aspect of the disclosure provides an apparatus comprising: an interface for communicating with one or more memory devices; a memory controller, the memory controller having logic that causes the memory controller to: detect an uncorrectable error associated with a first data read from a memory address of a DRAM device; invert the first data to produce reference data and generate a reference error correction code (ECC) associated with the reference data; write the reference data to the memory address; read data from the memory address; compare the data read from the memory address to the reference data written to the memory address to determine whether there is a mismatched bit pattern indicating at least one mismatched bit between the reference data written to and the data read from the memory address; identify one or more faulty data pins (DQs) associated with the DRAM device based on the mismatched bit pattern; and correct, using the mismatched bit pattern, the uncorrectable error located at the one or more identified faulty DQs.

According to some examples, correcting the uncorrectable error further causes the memory controller to correct the first data based on the identified one or more faulty DQs and one or more ECCs associated with the first data to produce corrected data.

In the foregoing embodiments, the logic further causes the memory controller to, based on determining the data read from the memory address matches the reference data written to the memory address: execute additional read transactions on the memory address; compare data read from the memory address as a result of the additional read transactions to new reference data written to the memory address; and based on determining the data read from the memory address as a result of the additional read transactions matches the new reference data written to the memory address: determine the memory address is not associated with a faulty DQ; and flag the memory address and a corresponding DQ for manual inspection.

According to some examples, the logic comprises hardware logic. According to some examples, the logic is implemented in an application-specific integrated circuit (ASIC).

Another aspect of the disclosure provides a system comprising: a dual in-line memory module (DIMM) comprising a plurality of DRAM devices; a memory controller configured to communicate with the plurality of DRAM devices and having logic that causes the memory controller to: detect an uncorrectable error associated with a first data read from a memory address of a DRAM device of the plurality of DRAM devices within the DIMM; invert the first data to produce reference data and generate a reference error correction code (ECC) associated with the reference data; write the reference data to the memory address; read data from the memory address; compare the data read from the memory address to the reference data written to the memory address to determine whether there is a mismatched bit pattern indicating at least one mismatched bit between the reference data written to and the data read from the memory address; identify one or more faulty data pins (DQs) associated with the DRAM device based on the mismatched bit pattern; and correct, using the mismatched bit pattern, the uncorrectable error located at the one or more identified faulty DQs.

According to some examples, inverting the first data further causes the memory controller to perform a bitwise flip on the first data.

According to some examples, a number of errors that can be corrected using ECC symbols is equal to a number of ECC symbols associated with the first data and stored in the DRAM device.

According to some examples, the logic comprises hardware logic. According to some examples, the logic is implemented in an application-specific integrated circuit (ASIC).

In the foregoing embodiments, the memory controller is further configured to, based on determining the data read from the memory address matches the reference data written to the memory address: execute additional read transactions on the memory address; compare data read from the memory address as a result of the additional read transactions to new reference data written to the memory address; and based on determining the data read from the memory address as a result of the additional read transactions matches the new reference data written to the memory address: determine the memory address is not associated with a faulty DQ; and flag the memory address and a corresponding DQ for manual inspection.

In the foregoing embodiments, the logic further causes the memory controller to: perform a plurality of read requests on the memory address; and characterize, based on the plurality of read requests, the uncorrectable error, wherein error characterizations comprise one or more of a transient error, an intermittent error, and a permanent error.

DETAILED DESCRIPTION

Figure 1A:
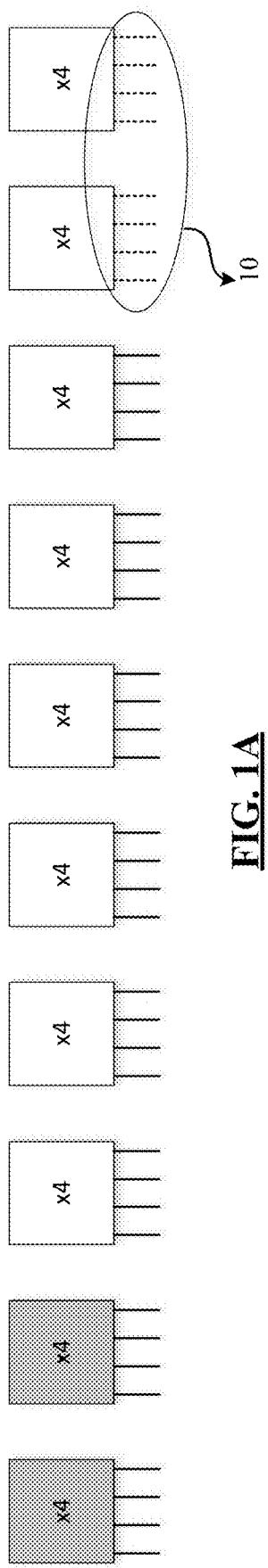
FIGS. 1A-1C illustrate example DIMM configurations, in accordance with aspects of the disclosed technology.

Aspects of the disclosed technology include methods and mechanisms for determining the location of memory errors detected as UEs and using erasure code to correct the detected UEs once the location is known-thereby prolonging the life of a DRAM device and a DIMM of which the DRAM is a part. For example, an initial read transaction may be executed at a memory address on the DRAM device located on the DIMM, and a UE may be detected as a result of the read transaction. The data that is read from the memory address may undergo inversion (e.g., a bitwise flip) to generate reference data (e.g., the inverted data that is generated as a result of the bitwise flip, such as inverted data symbols) and the reference data may be written back to the memory address. A second read transaction may be executed on the memory address. The data read from the memory address as a result of the second read transaction may be compared to the reference data written to the memory address. If the data read from the memory address is the same as the reference data, additional read transactions may be executed on the memory address to determine whether a corresponding DQ may be incorrectly indicating that the memory address is associated with a UE. Additionally or alternatively, if the data read from the memory address is different from the reference data, the reference data within the memory address may be corrected using erasure code and corrected data may be written to the memory address. In particular, error correction code symbols may be used to correct data symbols associated with the detected memory error.

The DIMMs discussed herein may vary in size and storage capacity. Further, in explaining aspects of the disclosed technology, the memory devices (e.g., DDR5 DRAM devices) described herein may make use of the DDR5 standard or architecture, though the disclosed technology may be used with other standards (e.g., DDR4, HBM, etc.). DDR5 DRAM devices used in server applications may have 4 or 8 DQs. A DQ is an I/O data pin of a DRAM device that may drive data upon request. In explaining aspects of the disclosed technology, each DRAM device is assumed to include 4 DQs, although it is understood that a DRAM device may have more or fewer DQs. A burst access to such a DRAM device may be assumed to include 16 beats and data may be transferred in 64 byte data blocks. A typical DDR5 server configuration is the 10×4 configuration, although alternative DDR5 server configurations may be implemented, including those described below. Upon request, 4 DQs may drive a 4-bit data bus 16 times (1 bit per DQ for each of 16 beats), resulting in 64 bits or 8 bytes for each DRAM device. For 10 devices, a burst access may result in 640 bits or 80 bytes of data. The convention is to use 64 bytes (8 DRAMs) for data symbols and 16 bytes (2 DRAMs) for ECC symbols.

FIG. 1A illustrates an example 10×4 DIMM. As illustrated in FIG. 1A, the 10×4 DIMM may include 10 DRAM devices, each of which may include 4 DQs. The 10×4 DIMM may correspond to a Reed-Solomon (RS) scheme, such as (RS) (40, 32, 16). RS code may be used to detect and correct errors caused by faults when they are detected as a result of a DRAM memory read transaction. The RS (40, 32, 16) scheme may indicate that the 10×4 DIMM includes a total of 40 DQs, of which 32 DQs may be allocated for 32 data symbols (represented by the non-shaded DRAM devices) and 8 DQs may be allocated for 8 ECC symbols (represented by the shaded DRAM devices). Each symbol may be a 16-bit symbol. The number of ECC symbols (e.g., 8 in the present example) may be identified using the acronym nECC. An RS (40, 32, 16) scheme may detect and correct up to nECC/2 erroneous symbols (e.g., in the example scheme nECC/2=8/2=4 erroneous symbols), assuming the location of the erroneous symbols is unknown. Such errors may be known as CEs. In a case where the erroneous symbols are known or may be determined, the scheme may correct up to nECC erroneous symbols (e.g., in the example scheme, 8 erroneous symbols), which is often referred to as "erasure code" capability. Such errors may be known as UEs.

In instances where the number of detected memory errors is greater than nECC/2, each memory error in excess of nECC/2 may be an UE. The UEs may be corrected using erasure code when the location of each UE is known. The use of the erasure code capability may prolong the lifespan of the faulty DRAM device (e.g., the DRAM device associated with at least one memory error). In such instances, the number of memory errors that may be corrected may equal nECC (e.g., assuming an RS (40, 32, 16) scheme, 8 erroneous symbols may be corrected).

For example, the 8 ECC symbols stored on the 10×4 DIMM may indicate that a maximum of 8 memory errors may be corrected in accordance with the methods herein, whereas previous industry solutions may have detected the 8 memory errors, but might not have corrected the 8 memory errors (e.g., may have corrected nECC/2 memory errors). The dotted DQs 10 in FIG. 1A may represent DQs associated with memory errors (e.g., erroneous symbols). In instances where the number of detected memory errors is equal to nECC, each of the detected memory errors may be UEs, but may be corrected using erasure code capability when the location of the memory error is known. For example, where 8 memory errors are detected and 8 ECC symbols are available, the 8 memory errors may be CEs when the location of each memory error is known.

While the 8 DQs associated with memory errors in FIG. 1A are illustrated on two DRAM devices, the DQs associated with memory errors may exist on any of the 8 DRAM devices allocated for data symbols. In some instances, each DQ of a single DRAM device may be associated with a memory error, thereby causing the DRAM device to malfunction. Further, in some instances, each DQ on two DRAM devices may be associated with a memory error, thereby causing both DRAM devices to malfunction. Consequently, the DRAM devices may be replaced.

Figure 1B:
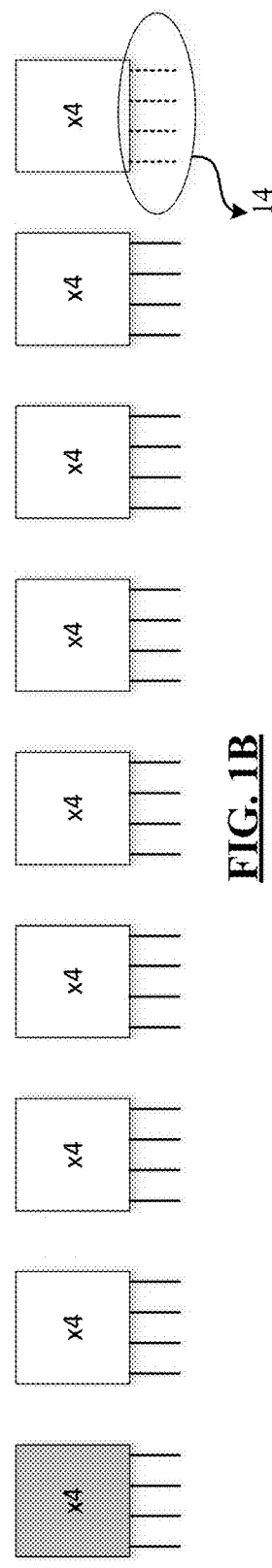

FIG. 1B illustrates an example 9×4 DIMM. As illustrated in FIG. 1B, the 9×4 DIMM may include 9 DRAM devices, each of which may include 4 DQs. The 9×4 DIMM may correspond to an RS (36, 32, 16) scheme, which may indicate that the DIMM includes a total of 36 DQs of which 32 DQs may be allocated for 32 data symbols (represented by the non-shaded DRAM devices) and the remaining 4 DQs may be allocated for 4 ECC symbols (represented by the shaded DRAM device). Each symbol may be a 16 bit symbol.

The 4 ECC symbols may indicate that a maximum of 4 memory errors may be corrected in accordance with the methods herein, whereas previous industry solutions may have detected the 4 memory errors, but might not have corrected the 4 memory errors (e.g., may have corrected nECC/2 memory errors). The dotted DQs 14 in FIG. 1B may represent DQs associated with memory errors. In instances where the number of detected memory errors is equal to nECC, each of the detected memory errors may be UEs, but may be corrected using erasure code capability when the location of the memory error is known. For example, where 4 memory errors are detected and 4 ECC symbols are available, the 4 memory errors may be CEs when the location of each memory error is known.

Figure 1C:
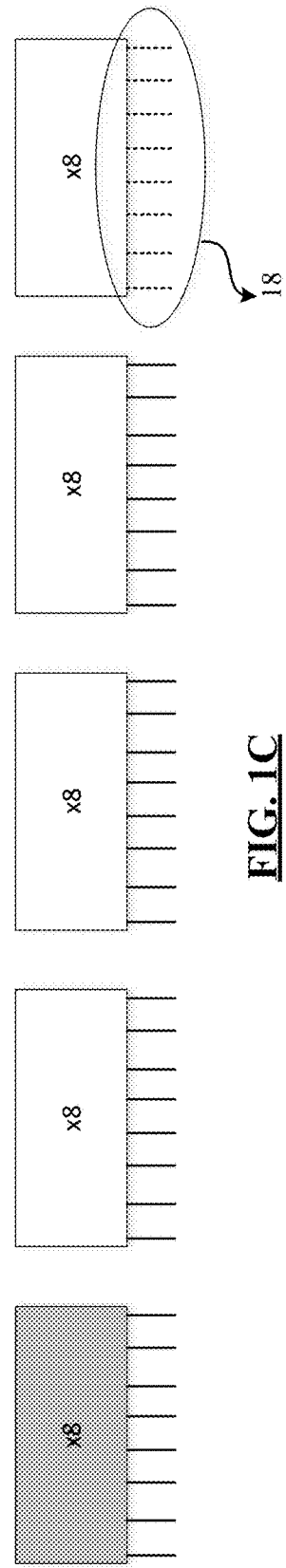

FIG. 1C illustrates an example 5×8 DIMM. As illustrated in FIG. 1C, the 5×8 DIMM may include 5 DRAM devices, each of which may include 8 DQs. The 5×8 DIMM may correspond to an RS (40, 32, 16) scheme, which may indicate that the DIMM includes a total of 40 DQs, of which 32 DQs may be allocated for 32 data symbols (represented by the non-shaded DRAM devices) and the remaining 8 DQs may be allocated for 8 ECC symbols (represented by the shaded DRAM device). Each symbol may be a 16 bit symbol.

The 8 ECC symbols stored on the 5×8 DIMM may indicate that a maximum of 8 memory errors may be corrected in accordance with the methods herein, whereas previous industry solutions may have detected the 8 memory errors, but might not have corrected the 8 memory errors (e.g., may have corrected nECC/2 memory errors). The dotted DQs 18 in FIG. 1C may represent DQs associated with memory errors (e.g., erroneous symbols). In instances where the number of detected memory errors is equal to nECC, each of the detected memory errors may be UEs, but may be corrected using erasure code capability when the location of the memory error is known. For example, where 8 memory errors are detected and 8 ECC symbols are available, the 8 memory errors may be CEs when the location of each memory error is known.

While only three types of DIMM configurations are illustrated, the technique and mechanism described herein may be implemented on DIMMs with DRAM device configurations that may be different from the examples.

Figure 2:
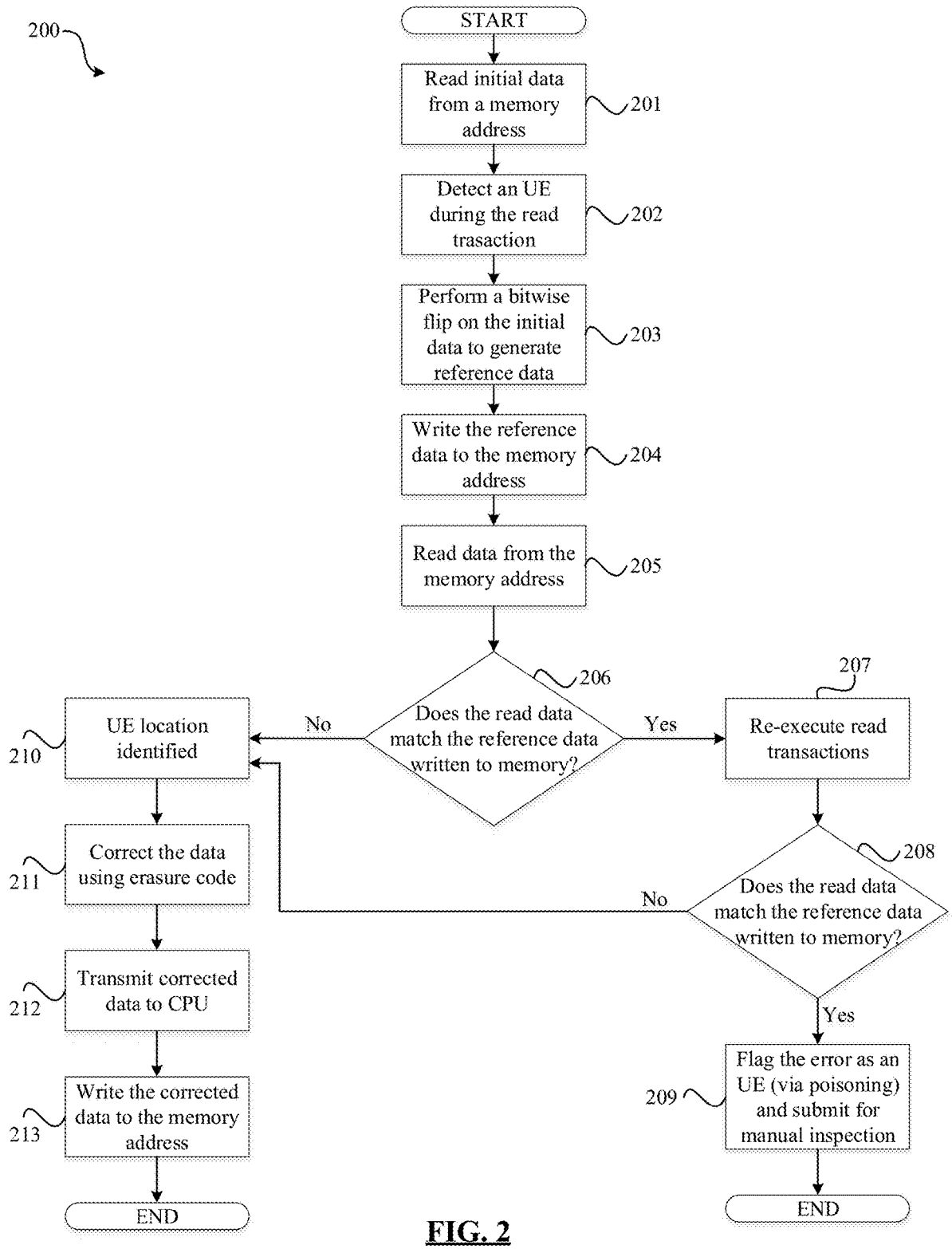
FIG. 2 illustrates an example system, in accordance with aspects of the disclosed technology.

FIG. 2 illustrates an example method for correcting uncorrectable memory errors in DIMMs using erasure code, in accordance with aspects of the disclosed technology. The steps described herein may be performed by one or more hardware components that may be added to current memory controllers, DRAM devices, or DIMMs (e.g., application-specific integration circuits (ASICs), field-programmable gate arrays (FPGAs), or other hardware-based processor). The steps described herein are presented in the current order by way of example and the order of steps are not meant to be limiting.

Referring to example method 200 illustrated in FIG. 2, at step 201, an initial (e.g., a first) read transaction may be executed upon a memory address within a DRAM device located on a DIMM. In some instances, an ASIC may be configured to execute the initial read transaction. The initial read transaction may be the result of a central processing unit (CPU) requesting access to data stored in the memory address. The data stored in the memory address may be retrieved and returned along with the ECC symbols stored along with the data written as part of a previous write transaction. Such read requests may be processed through a memory controller.

Figure 3A:
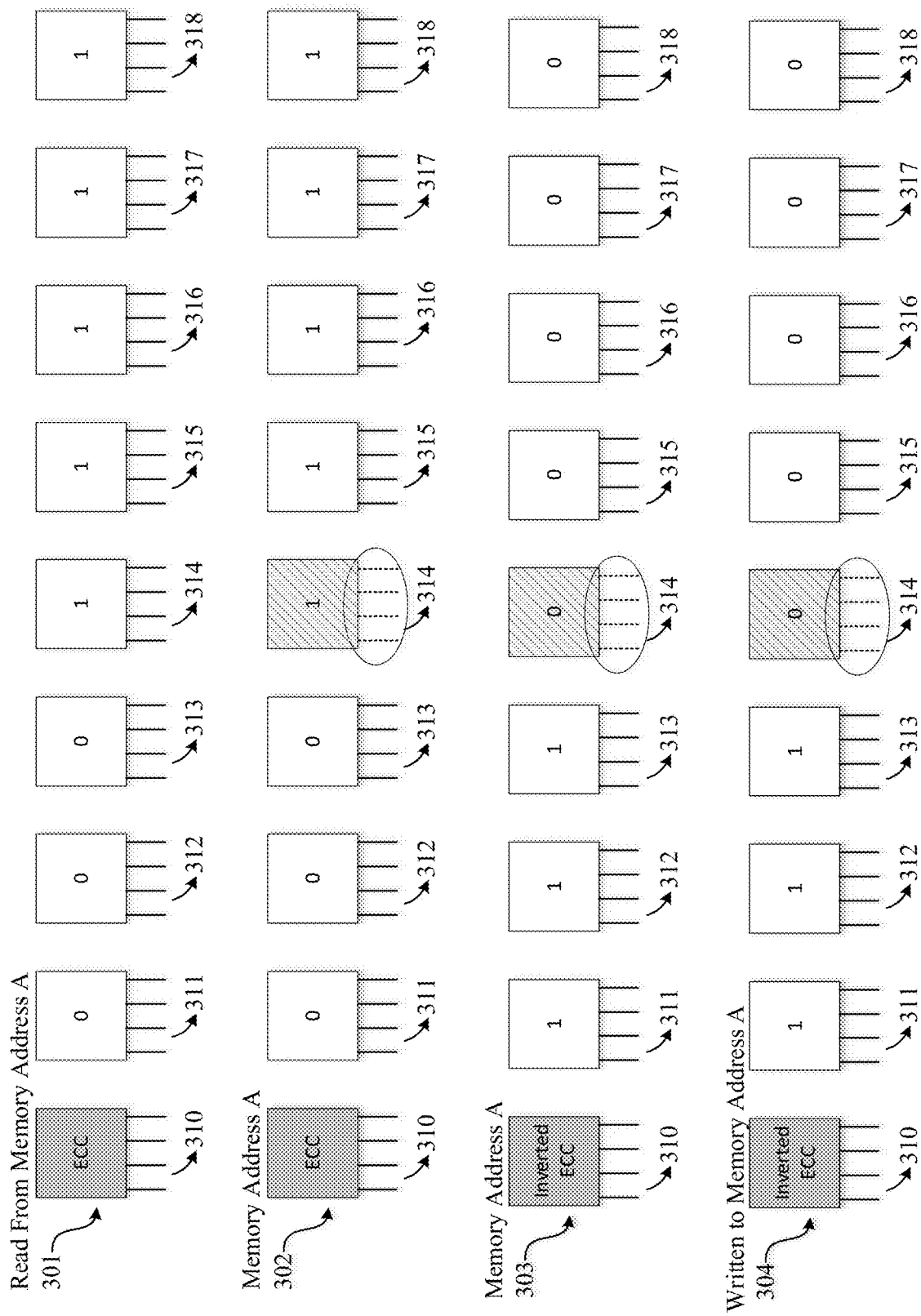
FIGS. 3A-3B illustrate an example implementation of correcting uncorrectable memory errors in DIMMs using erasure code, in accordance with aspects of the disclosed technology.
Figure 3B:
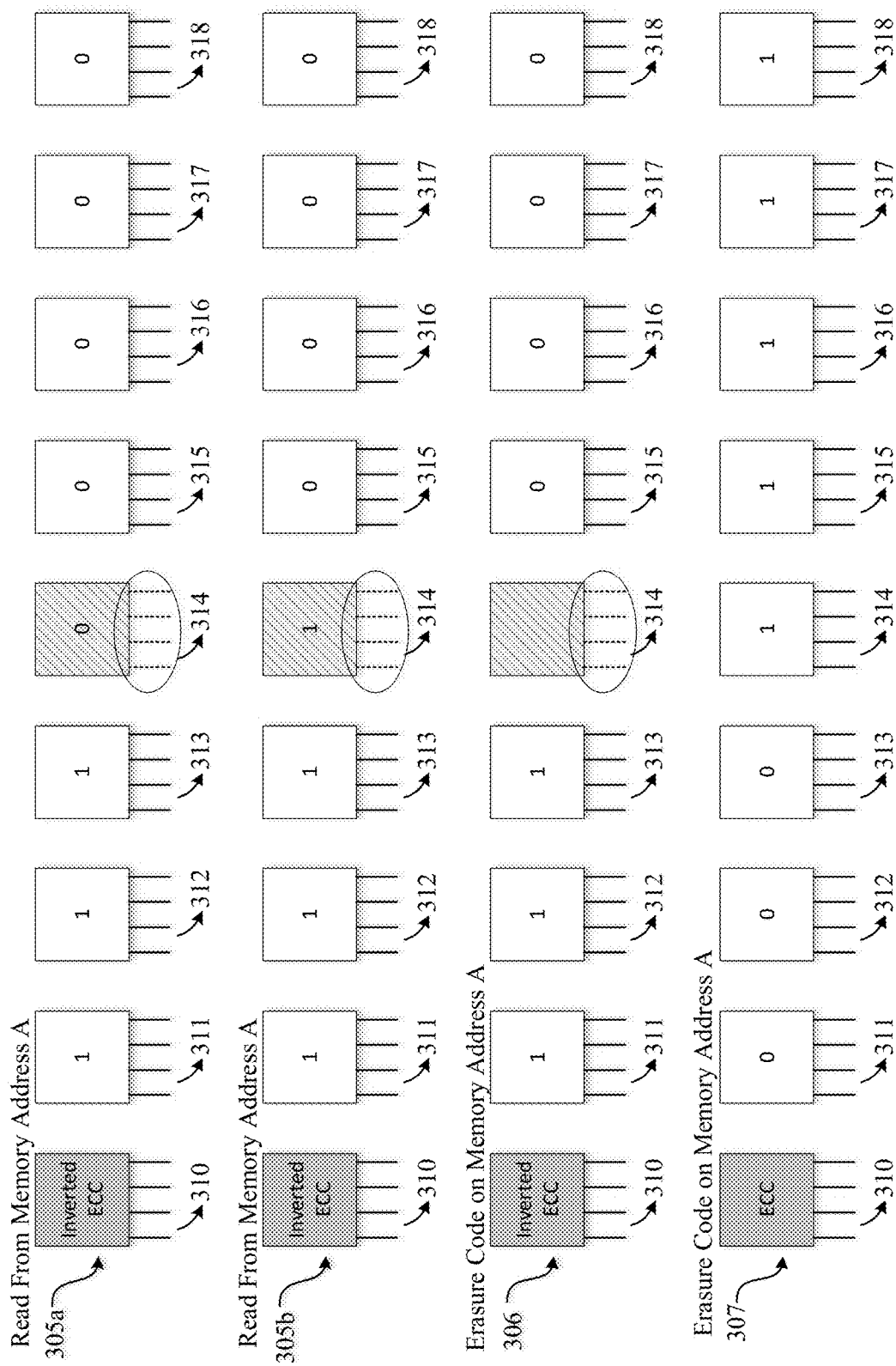

FIGS. 3A-3B illustrate an example implementation of the method described herein, and are discussed in conjunction with FIG. 2. The DIMM used by way of example in FIGS. 3A-3B may be a DDR5 9×4 DIMM. As illustrated in configuration 301, data read from memory address A may correspond to a bit pattern (e.g., 00011111). The bit pattern may be read from the farthest left bit position to the farthest right bit position.

At step 202, one or more UEs may be detected as a result of the initial read transaction. In some instances, the ASIC may be configured to detect the one or more UEs. A detected memory error may indicate that the initial data read from at least one bit position of the bit pattern might not reflect data that was expected to be read from the at least one bit position (e.g., a bit may be stuck in an incorrect bit state, thereby triggering memory errors when read transactions are executed on the memory address). The detected memory error may be an UE if the number of memory errors detected on the DRAM device is greater than nECC/2. In some instances, the detected memory errors may be UEs if the number of memory errors detected on the DRAM device is equal to nECC and if the locations of the memory errors are unknown.

Using configuration 302 as an example, each DQ on a single DRAM, such as DRAM device 314, may be associated with a memory error (e.g., may be associated with erroneous data symbols). Since 4 ECC symbols may be stored on a DRAM device, such as in DRAM device 310, and 4 memory errors may be detected, the detected memory errors may be UEs.

At step 203, the initial data read from the memory address in response to the initial read transaction (e.g., first data) may be written to a memory controller. In some instances, the ASIC may be configured to write the initial data to the memory controller. The initial data read from the memory address may undergo a bitwise flip (e.g., inversion) to generate reference data. In some instances, the ECC symbols stored on the DRAM device may undergo a bitwise flip. In some instances, the ASIC may be configured to invert the initial data to generate the reference data and may invert the ECC symbols stored on the DRAM device. As illustrated in configuration 303, the bitwise flip performed on memory address A may change each bit to its opposite to generate a new bit pattern that corresponds to the reference data (e.g., 11100000).

At step 204, the generated reference data may be written back to the memory address upon which the initial read transaction was executed (e.g., as written reference data). The inverted ECC symbols may be written back to a DRAM device that stores the ECC symbols. In some instances, the ASIC may be configured to write the reference data and the inverted ECC symbols back to the memory address. As illustrated in configuration 304, the generated reference data (e.g., 11100000) may be written back to DRAM devices 311-318 of memory address A while the inverted ECC symbols may be written back to DRAM device 310, which stored the original ECC symbols.

At step 205, a second read transaction may be executed upon the memory address. In some instances, the ASIC may be configured to execute the second read transaction. Referring to FIG. 3B and as illustrated in configurations 305a and 305b, the data read from the memory address as a result of the second read transaction may either match the reference data that was written to the memory address (e.g., configuration 305a) or be different from the reference data that was written to the memory address (e.g., configuration 305b). Each scenario is discussed below.

At step 206, the data read from the memory address as a result of the second read transaction (e.g., read reference data) may be compared to the reference data that was previously written to the memory address (e.g., the written reference data) to determine whether the data read from the memory address matches the reference data. In some instances, the ASIC may be configured to perform the comparison. In particular, the bit pattern of the reference data read from the memory address may be compared to the bit pattern of the original reference data written to the memory address to determine whether there is a mismatched bit pattern indicating at least one mismatched bit between the bit pattern of the data read from the memory address and the bit pattern of the original reference data written to the memory address. A mismatched bit pattern may indicate that at least one data symbol within the data read from the memory address may be different from the data symbol in the same position within the reference data written to the memory address.

If, at step 206, it is determined that the bit pattern of the data read from the memory address as a result of the second read transaction matches the bit pattern of the reference data previously written to the memory address, then, at step 207, additional read transactions may be executed on the memory address to determine whether a UE exists within the DRAM device. In some instances, the ASIC may be configured to perform the additional read transactions based on determining that the bit pattern of the data read from the memory address matches the bit pattern of the reference data. Additional read transactions may be needed in instances where the data symbols within the data read from the memory address as a result of the second transaction are the same as the data symbols within the reference data written to the memory address. As illustrated in configuration 305a, the bit pattern read from memory address A (e.g., 11100000) may match the bit pattern of the reference data written to memory address A in configuration 304 (e.g., 11100000).

The memory error that was initially detected (e.g., discussed in step 202) may indicate that the initial data read from the memory address associated with one or more DQs was incorrect. As such, the one or more DQs may be expected to repeatedly return incorrect data (e.g., erroneous symbols). If the one or more DQs return correct data (e.g., data that is expected at a particular bit position in the bit pattern, data symbols that are expected at a particular position), then it may be determined that the initial memory error may have been incorrectly flagged as a memory error. Therefore, additional read transactions may be executed to further analyze the data that the one or more DQs may write to the memory address and/or read from the memory address, and to determine whether the one or more DQs function as expected.

In addition to executing additional read transactions upon the memory address, the steps described above may be repeated in response to each additional read transaction. In some instances, the ASIC may be configured to execute the steps described above when executing additional read transactions. For example, in response to executing a third read transaction upon the memory address, the data read from the memory address in response to the third read transaction may undergo a bitwise flip (e.g., by the ASIC) to generate new reference data (and the ECC symbols stored within the DRAM device may also undergo a bitwise flip to generate inverted ECC symbols). The new reference data (and the inverted ECC symbols) may be written back to the memory address and a fourth read transaction may be executed upon the memory address to read data from the memory address.

At step 208, the data read from the memory address as a result of the additional (e.g., fourth) read transaction may be compared to the new reference data that was written to the memory address. In some instances, the ASIC may be configured to perform the comparison. In particular, a bit pattern of the data read from the memory address as a result of the additional (e.g., fourth) read transaction may be compared to the bit pattern of the new reference data written to the memory address to determine whether there is a mismatched bit pattern indicating at least one mismatched bit between the bit pattern of the data read from the memory address as a result of the additional (e.g., fourth) read transaction and the bit pattern of the reference data written to the memory address. A mismatched bit pattern may indicate that at least one data symbol within the data read from the memory address may be different from the data symbol in the same position within the new reference data written to the memory address.

If, at step 208, it is determined that the data (e.g., the bit pattern, the data symbols) read from the memory address as a result of the additional (e.g., fourth) read transaction matches the new reference data (e.g., the bit pattern of the new reference data, the data symbols in the new reference data) that was written to the memory address, then, at step 209, the memory error may be flagged for manual inspection. In some instances, the ASIC may be configured to flag the detected memory error based on determining the data read from the memory address as a result of the additional read transaction matches the new reference data. A further analysis of the memory error and the corresponding DQ may be required to explain why the DQ was flagged as being associated with a memory error when the multiple read transactions demonstrate that the DQ may write new data to the memory address (e.g., the reference data or the new reference data) and may correctly read data from the memory address (e.g., the bit pattern read from the memory address may match the bit pattern of the reference data or the bit pattern of the new reference data). In some instances, the memory error may be flagged as a UE via poisoning (e.g., a signature intended to identify corrupted memory data may have been stored in the memory address associated with the DQ in question and may have triggered the initial memory error detection). In such instances, the UE may be submitted for manual inspection to avoid silent data corruption (SDC).

However, if, at either of steps 206 or 208, it is determined that the data (e.g., the bit pattern, the data symbols) read from the memory address (e.g., in response to the second read transaction or a subsequent read transaction) does not match the reference data (e.g., the bit pattern of the reference data, data symbols within the reference data, the bit pattern of the new reference data, data symbols within the new reference data) written to the memory address, then, at step 210, the DQ upon which the memory error was flagged may be confirmed as a location of an UE. In some instances, the ASIC may be configured to confirm the location of the detected UE based on determining the data read from the memory address is different from the reference data written to the memory address. As illustrated in configuration 305b, the bit pattern read from memory address A (e.g., 11110000) might not match the bit pattern of the reference data written to memory address A in configuration 304 (e.g., 11100000). As such, a mismatched bit pattern may indicate at least one mismatched bit between the bit pattern of the data read from the memory address (e.g., in response to the second read transaction or a subsequent read transaction) and the bit pattern of the reference data (or the bit pattern of the new reference data) written to the memory address.

At step 211, the memory error within the memory address may be corrected using erasure code capability. In some instances, the ASIC may be configured to correct the detected memory error using the described erasure code capability. Erasure code capability may allow for the removal (e.g., erasure, deletion) of the incorrect data stored within the memory address (e.g., erroneous data symbols stored in the memory address). As illustrated in configuration 306, the data associated with the faulty DQs of DRAM device 314 may be erased from memory address A. Erasure code capability may further allow the correct data to be written to the memory address.

In some instances, the correct data may be the same as the initial data (e.g., the same bit pattern as the initial data, the same data symbols as the initial data) or may be different data. As previously discussed, in a case where the erroneous symbols are known or may be determined, an error correction scheme may correct up to nECC erroneous symbols (e.g., in the example scheme, 8 erroneous symbols), which is often referred to as "erasure code" capability. In accordance with an aspect of the disclosed technology, by inverting the data symbols, a mechanism is provided to improve the ability to determine or better pinpoint the location of the erroneous symbols and correct them using the erasure code. In this way, the life of the faulty DRAM device may be extended, thus extending the life of the DIMM.

At step 212, the corrected data may be transmitted to the CPU of the system that requested the data from the memory address (e.g., the CPU of the system that executed the read transactions upon the memory address). In some instances, the ASIC may be configured to transmit the corrected data to the CPU of the system that requested the data from the memory address.

At step 213, the corrected data may be written to the memory address. In some instances, the ASIC may be configured to write the corrected data to the memory address. As illustrated in configuration 307, the corrected data written to memory address A may be the same as the initial data read from memory address A during the initial read transaction (e.g., 00011111). Writing the corrected data to the memory address may further include undoing the bitwise flip and/or returning the data within the memory address to its original state (e.g., returning each bit of the bit pattern to its original position).

In some instances, results of the read transactions (e.g., the initial read transaction, the additional read transactions) may be used to categorize detected errors (e.g., detected UEs), where a detected error may be one of a transient error, an intermittent error, or a permanent error. A transient error may be a one-off error that is expected during normal operations of the DRAM device. Transient errors typically do not indicate hardware damage. Transient errors may occur more infrequently (e.g., once) within some predetermined time period or predetermined number of memory transactions than intermittent errors (e.g., multiple times). An intermittent error may repeatedly occur in the same location (e.g., a particular DRAM memory address). A permanent error may occur in the same location (e.g., the particular DRAM memory address) each time the location is accessed.

Figure 4:
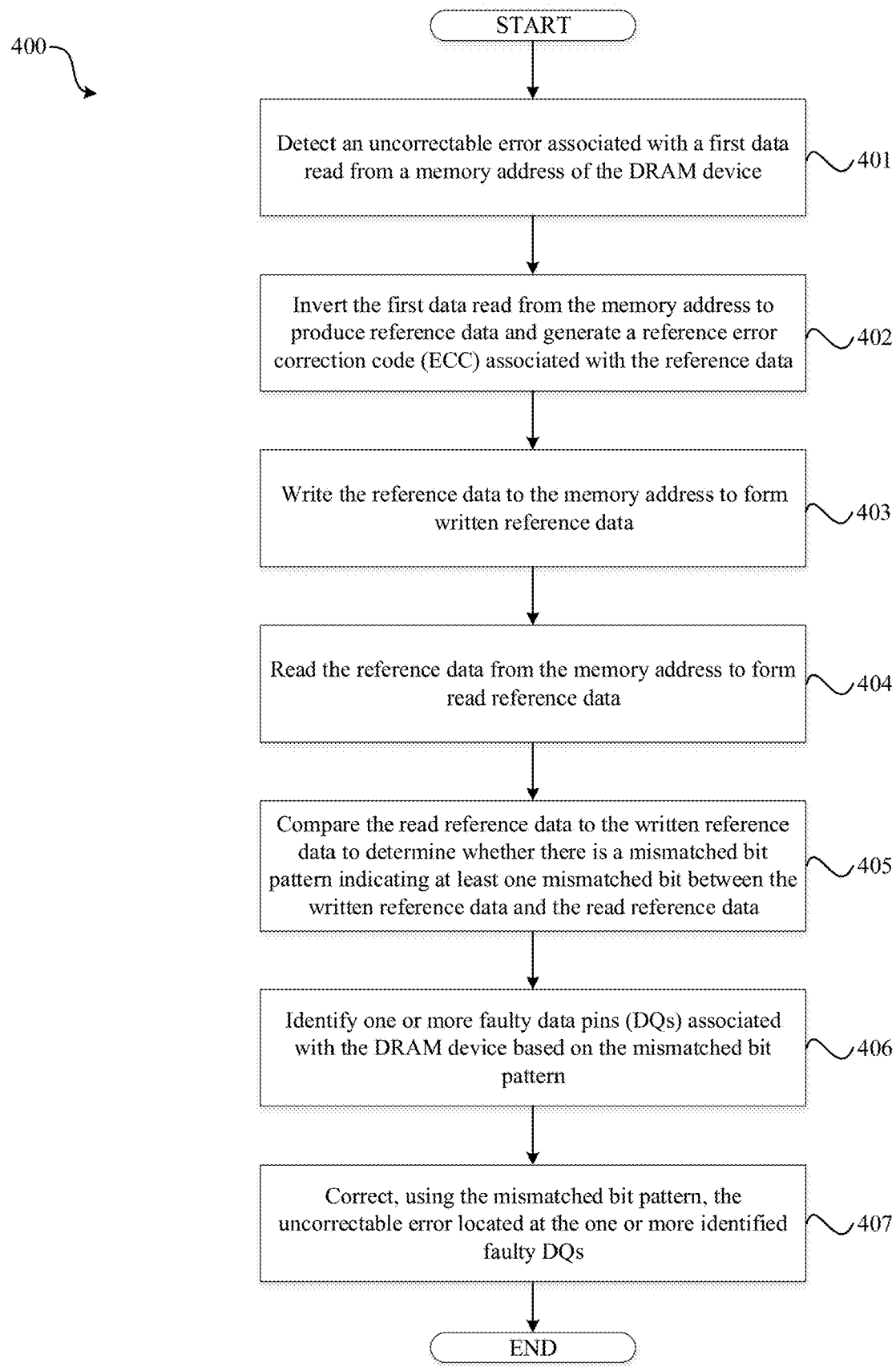
FIG. 4 illustrates an example process of correcting uncorrectable memory errors in DIMMs using erasure code, in accordance with aspects of the disclosed technology.

FIG. 4 illustrates an example process of correcting uncorrectable memory errors in DIMMs using erasure code, in accordance with aspects of the disclosed technology. The steps described herein may be performed by one or more hardware components that may be added to current memory controllers, DRAM devices, or DIMMs (e.g., application-specific integration circuits (ASICs)). The steps described herein are presented in the current order by way of example and the order of steps are not meant to be limiting.

Referring to example process 400 illustrated in FIG. 4, at step 401, an ASIC may detect an UE as a result of a first read transaction upon a memory address within a DRAM device located on a DIMM. The UE may be associated with first data read from the memory address as a result of the first read transaction.

At step 402, the ASIC may invert the first data read from the memory address as a result of the first read transaction and may invert error correction code (ECC) stored on the DIMM. Inverting the first data may include performing a bitwise flip on the first data and inverting the ECC may include performing a bitwise flip on the ECC stored on the DIMM. The inverted first data may be referred to as reference data and the inverted ECC may be referred to as reference ECC.

At step 403, the ASIC may write the reference data back to the memory address, thereby forming written reference data. The ASIC may also write the reference ECC back to a DRAM device dedicated to storing ECC.

At step 404, the ASIC may read the reference data from the memory address, thereby forming read reference data.

At step 405, the ASIC may compare the read reference data to the written reference data to determine whether there is a mismatched bit pattern indicating at least one mismatched bit between the written reference data and the read reference data. The comparison may indicate whether the read reference data matches the written reference data by determining whether each bit of the bit pattern associated with the read reference data matches each bit of the bit pattern associated with the written reference data.

At step 406, the ASIC may use the mismatched bit pattern to identify at least one faulty data pin (DQ) associated with the DRAM device. The faulty DQ may indicate the location of the detected UE within the memory address.

At step 407, the ASIC may correct the UE located at the faulty DQ using the mismatched bit pattern. The ASIC may further implement erasure code capability, discussed above, to correct the detected UE.

Figure 5:
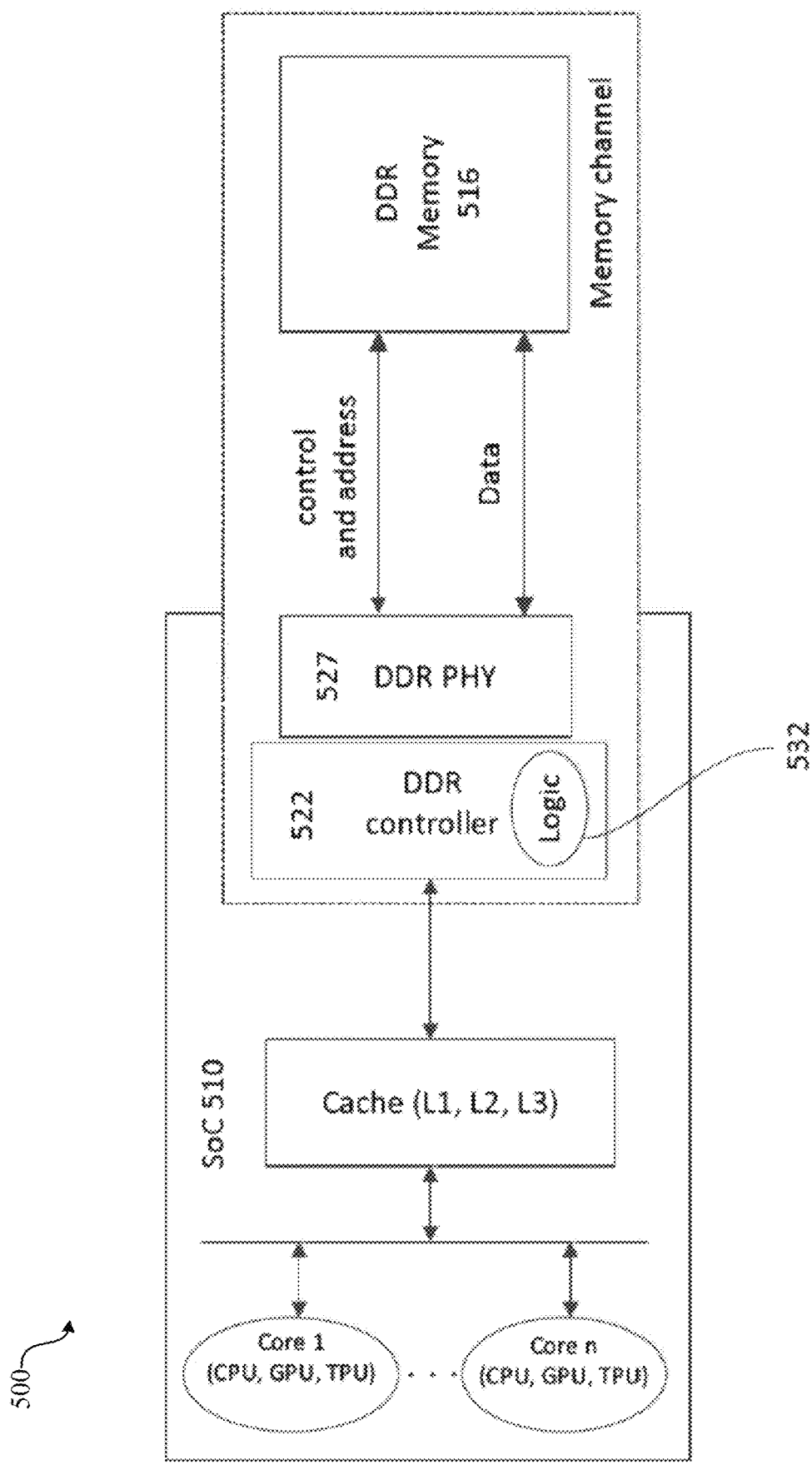
FIG. 5 illustrates an example system or apparatus used for correcting uncorrectable memory errors in DIMMs using erasure code, in accordance with aspects of the disclosed technology.

FIG. 5 illustrates an example system that may be used for correcting uncorrectable memory errors in DIMMs using erasure code, in accordance with aspects of the disclosed technology. System 500 may include a system on a chip (SoC) 510 communicatively coupled to a DDR memory 516. While DDR memory 516 is shown as one block, it should be understood to also include multiple DRAM devices or one or more DIMMs. The SoC 510 may include a DDR controller 522 and DDR physical interface 527, through which command and address information and data may be transferred between the SoC 510 and DDR memory 516.

The DDR controller 522 may include logic 532 that implements the method or processes discussed above in relation to FIGS. 1A to 4. Specifically, the SoC 510, as part of processing information (e.g., using processing elements forming its one or more cores), may need data to be recalled from DDR memory 516. Logic 532, in the form of one or more instructions, may be configured to implement the process flow of FIG. 2 to detect memory errors, identify locations of the detected memory errors, and correct the detected memory errors, as discussed above. In an example implementation, detecting and correcting memory errors may be implemented in hardware logic within DDR controller logic 532. The technology may take the form of one or more hardware components that may be added to current memory controllers, DRAM devices, or DIMMs (e.g., ASIC components). The disclosed technology offers an addition to current DRAM device architecture that detects UEs and expands the current DIMM lifespan.

The system of FIG. 5 may be used in one or more larger systems, such as a server, host, smartphone, personal computer, or, more generally, any electronic device that may use a DRAM device. As indicated above, DRAM devices may play an important role in cloud computing systems. In addition, as the size of the DRAM devices continue to increase in such systems, the need for schemes that may lengthen the life of memory devices or modules in accordance with the disclosed technology may mitigate against unnecessary expenses and disruptions in operating the network. As such, the disclosed technology may be implemented in servers or host machines such as those shown in cloud computing system 800 of FIG. 6.

Figure 6:
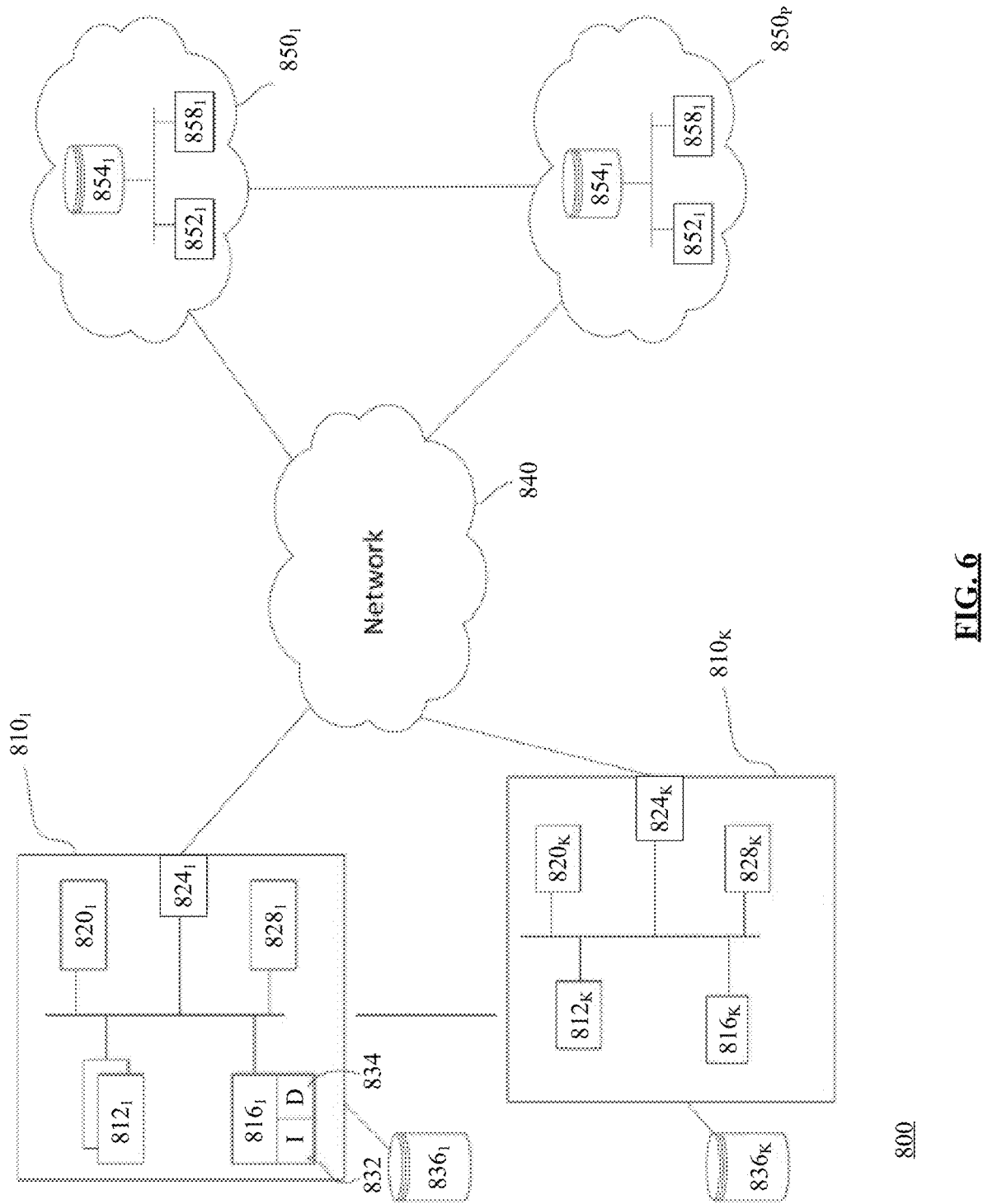
FIG. 6 illustrates an example system used for correcting uncorrectable memory errors in DIMMs using erasure code, in accordance with aspects of the disclosed technology.

FIG. 6 illustrates an example system that may be used for correcting uncorrectable memory errors in DIMMs using erasure code, in accordance with aspects of the disclosed technology. System 800 includes one or more computing devices 810, which may include computing devices 8101 through 810k, storage 836, network 840, and one or more cloud computing systems 850, which may include cloud computing systems 8501 through 850p. Computing devices 810 may include computing devices located at a user location that may make use of cloud computing services such as Infrastructure as a Service (IaaS), Platform as a Service (PaaS), and/or Software as a Service (SaaS). For example, if a computing device 810 is located at a business enterprise, computing device 810 may use cloud systems 850 as a service that provides software applications (e.g., accounting, word processing, inventory tracking, etc., applications) to computing devices 810 used in operating enterprise systems.

As illustrated in FIG. 6, each of computing devices 810 may include one or more processors 812 (e.g., processors 8121 and 812K), memory 816 (e.g., memories 816) and 816K) storing data 834 and instructions 832, display 820 (e.g., displays 8201 and 820K), communication interface 824 (e.g., communication interfaces 8241 and 824K), and input system 828 (e.g., input systems 8281 and 828K). The processors 812 and memories 816 may be communicatively coupled as shown in FIG. 6, and may include memory controllers that implement the logic block illustrated in FIG. 5. Computing device 810 may also be coupled or connected to storage 836 (e.g., storages 8361 and 836K), which may include local and/or remote storage (e.g., on a Storage Area Network (SAN) that may store data, for example data accumulated as part of a user's operation). Computing device 810 may include a standalone computer (e.g., desktop or laptop) or a server associated with a user. A given user may also implement, as part of its business, multiple computing devices as servers. Memory 816 may store information accessible by the one or more processors 812, including instructions 832 and data 834 that may be executed or otherwise used by the processor(s) 812. The memory 816 may be of any type capable of storing information accessible by the processor, including a computing device-readable medium, or other medium that stores data that may be read with the aid of an electronic device, such as a hard drive, solid state drive, memory card, ROM, RAM, DVD, or other optical disks, as well as other write-capable and read-only memories. Systems and methods may include different combinations of the foregoing, whereby different portions of the instructions and data may be stored on different types of media.

The instructions 832 may be any set of instructions to be executed directly (such as machine code) or indirectly (such as scripts) by the processor 812. For example, the instructions may be stored as computing device code on the computing device-readable medium. In that regard, the terms "instructions" and "programs" may be used interchangeably herein. The instructions may be stored in object code format for direct processing by the processor, or in any other computing device language, including scripts or collections of independent source code modules that may be interpreted on demand or compiled in advance. Processes, functions, methods, and routines of the instructions are explained in more detail below.

The data 834 may be retrieved, stored, or modified by processor 812 in accordance with the instructions 832. As an example, data 834 associated with memory 816 may include data used in supporting services for one or more client devices, applications, etc. Such data may include data to support hosting web-based applications, file share services, communication services, gaming, sharing video or audio files, or any other network-based services.

The one or more processors 812 may be any conventional processor, such as commercially available CPUs. Alternatively, the one or more processors may be a dedicated device such as an FPGA, ASIC, or other hardware-based processor. Although FIG. 6 functionally illustrates the processor, memory, and other elements of computing device 810 as being within the same block, it will be understood by those of ordinary skill in the art that the processor, computing device, or memory may actually include multiple processors, computing devices, or memories that may or may not be located or stored within the same physical housing. In one example, one or more computing devices 810 may include one or more server computing devices having a plurality of computing devices (e.g., a load-balanced server farm) that may exchange information with different nodes of a network for the purpose of receiving, processing, and transmitting the data to and from other computing devices as part of user's business operation.

Computing device 810 may also include a display 820 (e.g., a monitor having a screen, a touch-screen, a projector, a television, or other device that is operable to display information) that may provide a user interface that allows for controlling the computing device 810. Such control may include, for example, using a computing device to cause data to be uploaded through input system 828 to cloud system 850 for processing, causing accumulation of data on storage 836, or more generally, managing different aspects of a user's computing system. While input system 828 may be used to upload data (e.g., a USB port), computing system 800 may also include a mouse, keyboard, touchscreen, or microphone that can be used to receive commands and/or data.

The network 840 may include various configurations and protocols including short range communication protocols such as Bluetooth™, Bluetooth™ LE, the Internet, World Wide Web, intranets, virtual private networks, wide area networks, local networks, private networks using communication protocols proprietary to one or more companies, Ethernet, WiFi, HTTP, etc., and various combinations of the foregoing. Such communication may be facilitated by any device capable of transmitting data to and from other computing devices, such as modems and wireless interfaces. Computing device 810 may interface with network 840 through communication interface 824, which may include the hardware, drivers, and software necessary to support a given communications protocol.

Cloud computing systems 850 may include one or more data centers that may be linked via high speed communications or computing networks. A given data center within system 850 may include dedicated space within a building that houses computing systems and associated components (e.g., storage systems and communication systems). A data center may include racks of communication equipment, servers/hosts, and/or disks. The servers/hosts and disks may include physical computing resources that are used to provide virtual computing resources such as VMs. To the extent that a given cloud computing system includes more than one data center, those data centers may be at different geographic locations within relative close proximity to each other, chosen to deliver services in a timely and economically efficient manner, as well as provide redundancy and maintain high availability. Similarly, different cloud computing systems may be provided at different geographic locations.

As illustrated in FIG. 6, computing system 850 may be illustrated as comprising infrastructure 852 (e.g., infrastructure 8521), storage 854 (e.g., storage 8541) and computer system 858 (e.g., computer system 8581). Infrastructure 852, storage 854, and computer system 858 may include a data center within a cloud computing system 850. Infrastructure 852 may include servers, switches, physical links (e.g., fiber), and/or other equipment used to interconnect servers within a data center with storage 854 and computer system 858. Storage 854 may include a disk and/or other storage device that may be partitionable to provide physical or virtual storage to virtual machines running on processing devices within a data center. Storage 854 may be provided as a SAN within the data center hosting the virtual machines supported by storage 854 or in a different data center that might not share a physical location with the virtual machines it supports. Computer system 858 may act as a supervisor and/or managing agent for jobs being processed by a given data center. In general, computer system 858 may contain the instructions necessary to, for example, manage the operations requested as part of a synchronous training operation on user data. Computer system 858 may receive jobs, for example, as a result of input received via an application programming interface (API) from a user.

Aspects of the disclosed technology may include a method, apparatus, system and/or non-transitory computer-readable medium for correcting uncorrectable memory errors in DIMMs using erasure code, in accordance with aspects of the disclosed technology.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description of the examples should be taken by way of illustration rather than by way of limitation of the subject matter defined by the claims. In addition, the provision of the examples described herein, as well as clauses phrased as "such as," "including," and the like, should not be interpreted as limiting the subject matter of the claims to the specific examples; rather, the examples are intended to illustrate only one of many possible implementations. Further, the same reference numbers in different drawings can identify the same or similar elements.

The invention claimed is:

1. A method for correcting uncorrectable errors associated with a DRAM device, the method comprising:
   detecting an uncorrectable error associated with a first data read from a memory address of the DRAM device;
   inverting the first data read from the memory address to produce reference data and generating a reference error correction code (ECC) associated with the reference data;
   writing the reference data to the memory address to form written reference data;
   reading the reference data from the memory address to form read reference data;
   comparing the read reference data to the written reference data to determine whether there is a mismatched bit pattern indicating at least one mismatched bit between the written reference data and the read reference data;
   identifying one or more faulty data pins (DQs) associated with the DRAM device based on the mismatched bit pattern; and
   correcting, using the mismatched bit pattern, the uncorrectable error located at the one or more identified faulty DQs.

2. The method of claim 1, wherein inverting the first data comprises performing a bitwise flip on the first data.

3. The method of claim 1, wherein correcting the uncorrectable error comprises correcting the first data based on the identified one or more faulty DQs and one or more ECCs associated with the first data to produce corrected data.

4. The method of claim 1, wherein a number of errors that can be corrected using ECC symbols is equal to a number of ECC symbols associated with the first data and stored in the DRAM device.

5. The method of claim 1, further comprising providing, to a CPU associated with the DRAM device, corrected data generated from correcting the first data.

6. The method of claim 5, further comprising writing the corrected data to the memory address associated with the first data.

7. The method of claim 1, further comprising, based on determining the read reference data matches the written reference data:
   executing additional read transactions on the memory address;
   comparing data read from the memory address as a result of the additional read transactions to new reference data written to the memory address; and
   based on determining the data read from the memory address as a result of the additional read transactions matches the new reference data written to the memory address:
      determining the memory address is not associated with a faulty DQ; and
      flagging the memory address and a corresponding DQ for manual inspection.

8. The method of claim 1, further comprising:
   performing a plurality of read requests on the memory address; and
   characterizing, based on the plurality of read requests, the uncorrectable error, wherein error characterizations comprise one or more of a transient error, an intermittent error, and a permanent error.

9. An apparatus comprising:
   an interface for communicating with one or more memory devices;
   a memory controller, the memory controller having logic that causes the memory controller to:
      detect an uncorrectable error associated with a first data read from a memory address of a DRAM device;
      invert the first data to produce reference data and generate a reference error correction code (ECC) associated with the reference data;
      write the reference data to the memory address;
      read data from the memory address;
      compare the data read from the memory address to the reference data written to the memory address to determine whether there is a mismatched bit pattern indicating at least one mismatched bit between the reference data written to and the data read from the memory address;
      identify one or more faulty data pins (DQs) associated with the DRAM device based on the mismatched bit pattern; and
      correct, using the mismatched bit pattern, the uncorrectable error located at the one or more identified faulty DQs.

10. The apparatus of claim 9, wherein correcting the uncorrectable error further causes the memory controller to correct the first data based on the identified one or more faulty DQs and one or more ECCs associated with the first data to produce corrected data.

11. The apparatus of claim 9, wherein the logic further causes the memory controller to, based on determining the data read from the memory address matches the reference data written to the memory address:
  execute additional read transactions on the memory address;
  compare data read from the memory address as a result of the additional read transactions to new reference data written to the memory address; and
  based on determining the data read from the memory address as a result of the additional read transactions matches the new reference data written to the memory address:
    determine the memory address is not associated with a faulty DQ; and
    flag the memory address and a corresponding DQ for manual inspection.

12. The apparatus of claim 9, wherein the logic comprises hardware logic.

13. The apparatus of claim 12, wherein the logic is implemented in an application-specific integrated circuit (ASIC).

14. A system comprising:
  a dual in-line memory module (DIMM) comprising a plurality of DRAM devices;
  a memory controller configured to communicate with the plurality of DRAM devices and having logic that causes the memory controller to:
    detect an uncorrectable error associated with a first data read from a memory address of a DRAM device of the plurality of DRAM devices within the DIMM;
    invert the first data to produce reference data and generate a reference error correction code (ECC) associated with the reference data;
    write the reference data to the memory address;
    read data from the memory address;
    compare the data read from the memory address to the reference data written to the memory address to determine whether there is a mismatched bit pattern indicating at least one mismatched bit between the reference data written to and the data read from the memory address;
    identify one or more faulty data pins (DQs) associated with the DRAM device based on the mismatched bit pattern; and
    correct, using the mismatched bit pattern, the uncorrectable error located at the one or more identified faulty DQs.

15. The system of claim 14, wherein inverting the first data further causes the memory controller to perform a bitwise flip on the first data.

16. The system of claim 14, wherein a number of errors that can be corrected using ECC symbols is equal to a number of ECC symbols associated with the first data and stored in the DRAM device.

17. The system of claim 14, wherein the logic comprises hardware logic.

18. The system of claim 17, wherein the logic is implemented in an application-specific integrated circuit (ASIC).

19. The system of claim 14, wherein the memory controller is further configured to, based on determining the data read from the memory address matches the reference data written to the memory address:
  execute additional read transactions on the memory address;
  compare data read from the memory address as a result of the additional read transactions to new reference data written to the memory address; and
  based on determining the data read from the memory address as a result of the additional read transactions matches the new reference data written to the memory address:
    determine the memory address is not associated with a faulty DQ; and
    flag the memory address and a corresponding DQ for manual inspection.

20. The system of claim 14, wherein the logic further causes the memory controller to:
  perform a plurality of read requests on the memory address; and
  characterize, based on the plurality of read requests, the uncorrectable error, wherein error characterizations comprise one or more of a transient error, an intermittent error, and a permanent error.

* * * * *